United States Patent [19]

Laroia

[11] Patent Number: 5,418,531
[45] Date of Patent: May 23, 1995

[54] STRUCTURED QUANTIZER FOR SOURCES WITH MEMORY

[75] Inventor: Rajiv Laroia, Bridgewater, N.J.

[73] Assignee: AT&T Corp., Murray Hill, N.J.

[21] Appl. No.: 139,483

[22] Filed: Oct. 20, 1993

[51] Int. Cl.⁶ .......................................... H03M 13/00
[52] U.S. Cl. ..................................... 341/94; 341/106; 375/242
[58] Field of Search ...................... 341/94, 200, 50, 51; 375/25, 34, 39, 27, 122

[56] References Cited

U.S. PATENT DOCUMENTS

| | | | |
|---|---|---|---|
| 5,214,672 | 5/1993 | Eyuboglu et al. | 375/34 |
| 5,297,170 | 3/1994 | Eyuboglu et al. | 375/25 |

OTHER PUBLICATIONS

R. Laroia, et al. *Proceedings of IEEE Intl Symposium on Information Theory*, San Antonio, Tex., Jan. 17–22, 1993, p. 169 "A New Structured Quantizer for Sources With Memory".

*Primary Examiner*—Brian K. Young
*Attorney, Agent, or Firm*—Gerard A. deBlasi

[57] ABSTRACT

An improved approximation of the desired codebook boundary is achieved, when quantizing data from a source with memory, by adding a dither sequence, the samples of which are contained within the Voronoi region of an unpartitioned lattice or the first level of lattice partitioning used to generate the trellis code. A sequence of data generated by the source with memory is quantized to a nearest sequence of a predetermined trellis code which is based on coset partitioning of a predetermined lattice into translates of a coset lattice. The trellis code sequence is then filtered with an inverse source filter. A dither sample is added to each sample of the sequence, such that (1) a sum of the dither sample and the filtered trellis code sequence sample lies on a super-lattice of the coset lattice, and (2) the dither sample is inside the Voronoi region of the super-lattice.

14 Claims, 4 Drawing Sheets

STRUCTURED QUANTIZER FOR SOURCES WITH MEMORY

FIELD OF THE INVENTION

This invention relates to methods for quantizing data generated by sources with memory and, more particularly, to methods for realizing both boundary and granular gains in quantizing data from sources with memory.

BACKGROUND OF THE INVENTION

Realizing both boundary gain and granular gain when quantizing data is widely recognized as being difficult to accomplish for a source with memory, in which samples output by the source are correlated rather than independent. One scheme which achieves both types of gain is described in Laroia et al., "A New Structured Quantizer for Sources With Memory," Proceedings of the International Symposium on Information Theory, San Antonio, Tex., Jan. 17-22, 1993, p. 169. This scheme first quantizes the source to a sequence of a trellis code (to realized granular gain). It then uses a memory encoder which removes the source memory and adds a dither sequence to the data so that conventional techniques for implementing codebook boundaries for the corresponding memoryless innovations source can be applied. However, because of the dither sequence, the implemented codebook boundary only approximates the desired codebook boundary for the innovations source. For low rate quantization, this approximation can lead to significant performance degradation. Moreover, since the samples of the dither sequence are contained in the Voronoi region of the final level of lattice partitioning, performance degradation depends on the number of coset partitions used to generate the trellis code that achieves the granular gain, and increases when a more powerful trellis code is used.

SUMMARY OF THE INVENTION

An improved approximation of the desired codebook boundary is achieved, when quantizing data from a source with memory, by adding a dither sequence, the samples of which are contained within the Voronoi region of an unpartitioned lattice or the first level of lattice partitioning used to generate the trellis code. Since these Voronoi regions are smaller, the dither energy needed to be added to the signal points is smaller than could be achieved in the prior art, thereby providing the better approximation of the desired codebook boundary.

In an exemplary embodiment of the invention, a sequence of data generated by a source with memory is quantized to a nearest sequence of a predetermined trellis code which is based on coset partitioning of a predetermined lattice into translates of a coset lattice. The trellis code sequence is then filtered with an inverse source filter. A dither sample is added to each sample of the filtered trellis code sequence, such that (1) a sum of the dither sample and the filtered trellis code sequence sample lies on a super-lattice of the coset lattice, and (2) the dither sample is inside the Voronoi region of the super-lattice.

DETAILED DESCRIPTION

This invention deals with the quantization of data generated by sources with memory and is capable of realizing both boundary gain and granular gain. As used herein, the term "granular gain" refers to the gain achieved from using a trellis code based codebook rather than a cubic lattice-based codebook when quantizing data. To realize granular gain, the quantized source sequences are selected to be sequences from a trellis code. The term "boundary gain" refers to the reduction in quantization noise achieved by having a non-cubic codebook boundary and is realized by selecting an appropriate boundary for the codebook depending on the source distribution. For the purposes of this disclosure, it is assumed that the trellis code is a one-dimensional (1D) trellis code with redundancy 1 bit/dimension.

Figure 1:
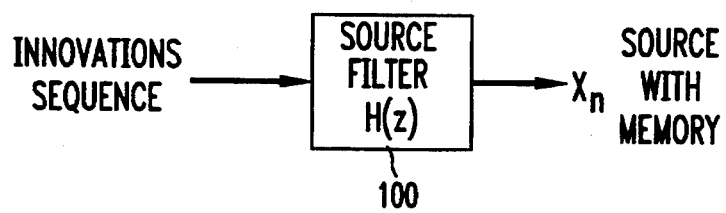
FIG. 1 is a block diagram of a model of an analog source with memory, the memory being represented by the source filter H(z)

FIG. 1 shows a source model in which a source with memory is generated when an innovations sequence passes through a source filter H(z) 100. The source filter outputs a sequence $X_n$ representing data from the source with memory. The term "memory" indicates that the samples of the source sequence are correlated rather than independent. Source filter 100 could change slowly with time as, for example, the linear predictive model of human speech. It is to be understood that the principles of the invention are equally applicable to quantizing both analog data (e.g., speech) and discretized data (e.g., a digital video signal or digitized speech) output from sources with memory. A typical application for quantizing discretized data is to reduce the precision of data stored digitally to reduce the required transmission rate.

Figure 2:
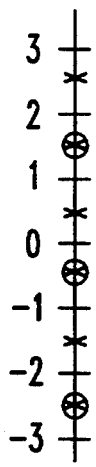
FIG. 2 shows a lattice translate $Z+\frac{1}{2}$ partitioned into two subsets A and B that may be used to generate a one-dimensional trellis code in accordance with the invention.

FIG. 2 shows an exemplary 1D lattice translate $Z+\frac{1}{2}$ partitioned into two subsets $A=2Z+\frac{1}{2}$ (identified on the figure by the symbol "x") and $B=2Z-\frac{1}{2}$ (identified on the figure by the symbol "$\overline{x}$"). Sets A and B represent the first level of partitioning used to generate a 1D trellis code with redundancy 1 bit/dimension. That is, each trellis state allows outgoing transitions corresponding to points in either set A or set B, but not in both. Sets A and B usually are both partitioned further, with the number of such subsequent partitions depending on the particular trellis code to be implemented. The final partitions constitute translates (cosets) of a single lattice called the "coset lattice."

Figure 3:
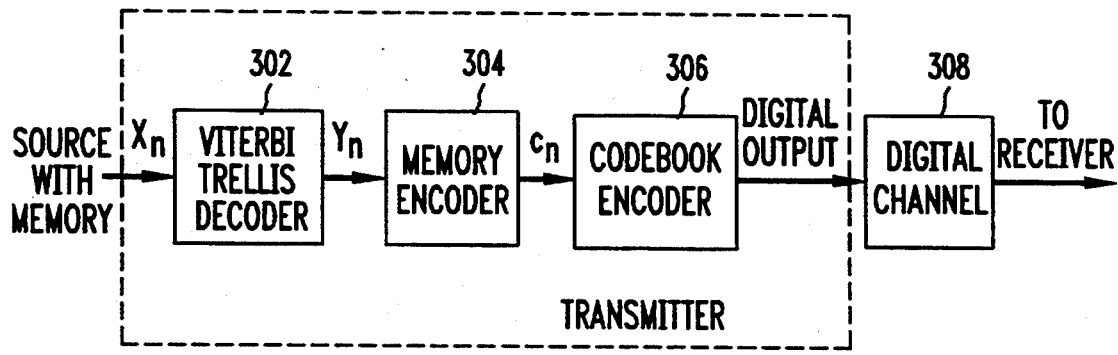
FIG. 3 is a block diagram of the transmitter portion of an intersymbol interference coded quantizer constructed in accordance with the principles of the present invention.

FIG. 3 shows a block diagram of an exemplary transmitter portion of the intersymbol interference coded quantizer of the present invention. The transmitter includes a Viterbi trellis decoder 302, a memory encoder 304 and a codebook encoder 306. The transmitter receives analog data from an analog source with memory. The output $X_n$ of the source is provided to Viterbi trellis decoder 302, which quantizes the source sequence to the nearest sequence of the trellis code. An exemplary trellis code suitable for use with the invention is the Ungerbock 4-state, one-dimensional trellis code. This nearest trellis code sequence generated by the Viterbi trellis decoder is output to memory encoder 304. Memory encoder 304, an example of which is described below with reference to FIG. 5, operates to remove the memory in the trellis code sequence. Memory encoder 304 also performs a predetermined invertible nonlinear operation (two exemplary operations are described below) which ensures that the output of memory encoder 304 is an uncoded sequence of points in set $A=2Z+\frac{1}{2}$. Codebook encoder 306 receives and encodes the output of memory encoder 304 to generate a digital output stream for transmission on a digital channel 308. Digital channel 308 illustratively is a transmission medium, but alternatively could be a storage medium, such as a magnetic, optical, or electrical storage medium.

The output of memory encoder 304, which is a memoryless sequence of points in A, can be thought of as corresponding to a quantized representation of the innovations sequence in the source model of FIG. 1. Thus, the output of memory encoder 304 can be encoded using a codebook encoder similar to that used to encode the output of a quantizer which quantizes the samples of the memoryless innovations source to points in A. This can be done by encoding all output sequences from the memory encoder that are inside the innovations codebook. The innovations codebook is a codebook with a boundary that is determined by the probability density of the innovations samples. Suitable algorithms for performing this function are described in Laroia and Farvardin, "A Structured Fixed-Rate Vector Quantizer Derived from a Variable-Length Scaler Quantizer; Part I: Memoryless Sources," IEEE Transactions on Information Theory, May 1993, which is hereby incorporated by reference.

Codebook encoder 306 converts the output of memory encoder 304 to binary bits by assigning an address to the output. The binary output produced by codebook encoder 306 is transmitted over digital channel 308. If the output of memory encoder 304 is outside the boundary of the innovations codebook, the output is mapped to a nearby point which resides inside the codebook. This mapping could be performed using any conventional technique and is referred to as codebook overload.

Figure 4:
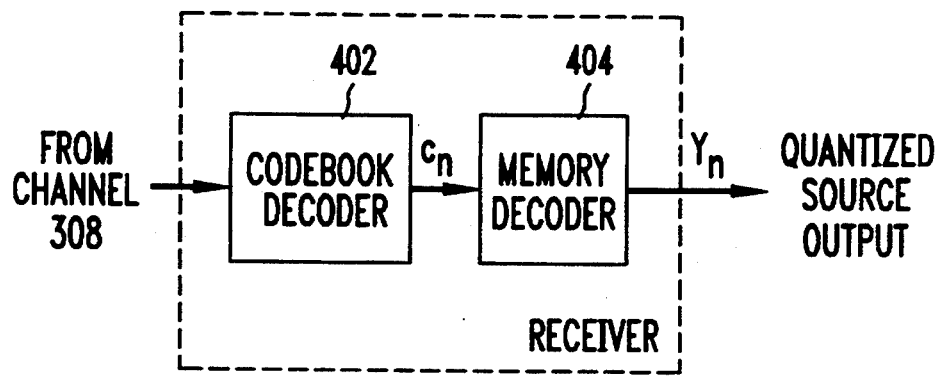
FIG. 4 is a block diagram of the receiver portion of an intersymbol interference coded quantizer constructed in accordance with the principles of the present invention.

FIG. 4 shows a block diagram of the receiver portion of the intersymbol interference coded quantizer of the invention. The receiver portion includes a codebook decoder 402 and a memory decoder 404. Binary data from digital channel 308 is input into codebook decoder 402. Codebook decoder 402 produces an uncoded sequence of points in A by mapping the binary data to points in the innovations codebook and outputs the sequence to memory decoder 404. Memory decoder 404 first performs the inverse of the nonlinear operation performed by memory encoder 304 (FIG. 3), and then uses the source filter $H(z)$ to regenerate the same trellis code sequence that was produced by Viterbi trellis decoder 302 in the transmitter. (Memory decoder 404 does not regenerate the same trellis code sequence that was produced by the Viterbi trellis decoder when there is a codebook overload.) Memory decoder 404 outputs the regenerated sequence which is the quantized source output approximating the source with memory.

Figure 5:
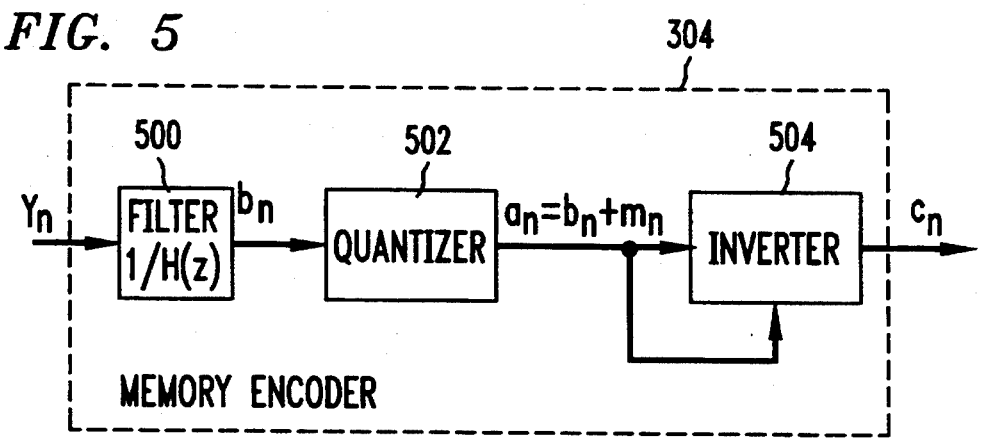
FIG. 5 is a block diagram of an exemplary embodiment of the memory encoder of the transmitter of FIG. 3.

FIG. 5 shows an exemplary embodiment of memory encoder 304. Memory encoder 304 includes a filter 500 having a transfer function $1/H(z)$ which is the inverse of source filter 100, a quantizer 502, and an inverter 504. Inverse source filter 500 operates to remove memory in the input trellis sequence $Y_n$. Filter 500 outputs a sequence $b_n$, which no longer consists of points on the lattice translate $Z+\frac{1}{2}$ of FIG. 2. To facilitate codebook encoding, a dither sample $m_n$ is added to each sample $b_n$ of the filter output such that $a_n=b_n+m_n$ is a point in $Z+\frac{1}{2}$ that is closest to $b_n$. This is equivalent to quantizing $b_n$ using quantizer 502 to the nearest point in $Z+\frac{1}{2}$ and $m_n$ being the negative of the quantization error. The quantization is performed such that $m_n$ is in the so-called Voronoi region V of the lattice Z shown on the plot of FIG. 6. (As used herein, the term "lattice" includes lattice translates. A lattice $\lambda_1$ is a "super-lattice" of lattice $\lambda_2$ if $\lambda_2$ is a sublattice of $\lambda_1$ and $\lambda_2$ is not a translate of $\lambda_1$.) This quantization operation is invertible (as described below with respect to the memory decoder) and does not add any noise to the final output of the quantizer. If the point in $Z+\frac{1}{2}$ that is closest to $b_n$ is in set A, the point is output from the memory encoder. If, however, the nearest point is in set B, the point is multiplied by $-1$ (in inverter 504) before it is output. Hence, the sequence output from memory encoder 304 consists of uncoded points in set A and, in a sense, represents a quantized version of the innovations sequence in the source model of FIG. 1.

The Voronoi region contains all points which are closer to the origin than to any other point on the lattice. The Voronoi region is bounded on one side by a solid dot, indicating that the signal point represented by the dot is included in the region. The other side of the Voronoi region is bounded by an empty dot, indicating that the signal point represented that dot is excluded from the region. One skilled in the art will appreciate the significance of the Voronoi region from the description below.

Figure 7:
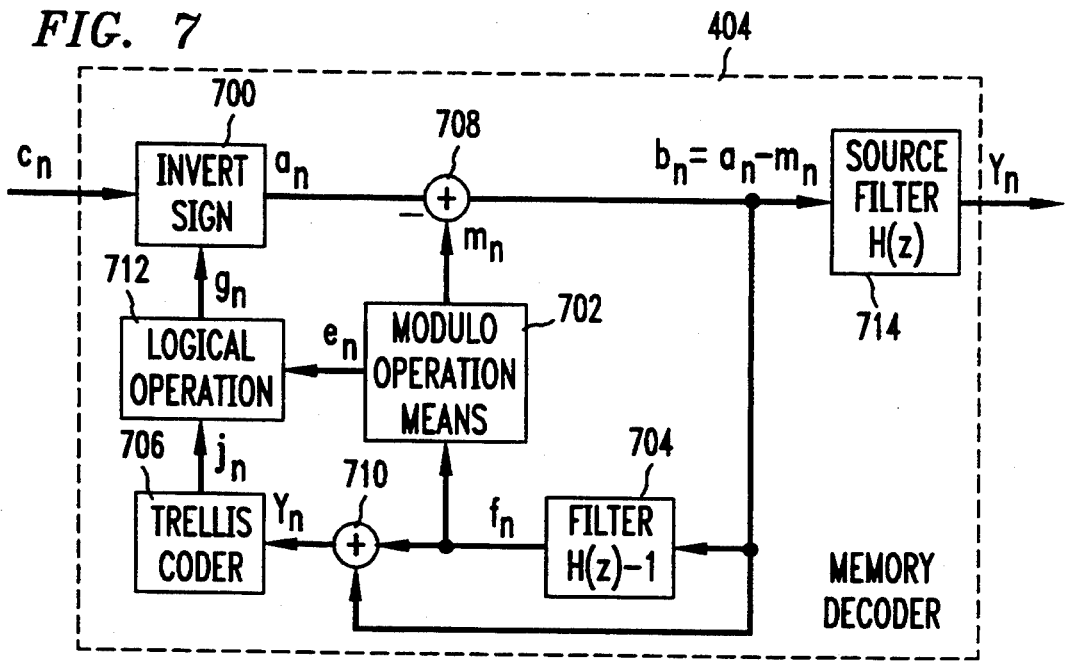
FIG. 7 is a block diagram of an exemplary embodiment of the memory decoder of the receiver of FIG. 4.

FIG. 7 shows an exemplary embodiment of memory decoder 404. The memory decoder includes a sign inverter 700, a modulo operation means 702, a filter 704, a trellis coder 706 (which is a finite-state machine), adder 708, exclusive-or gates 710 and 712, and a source filter 714. Memory decoder 404 performs the inverse of the function performed by memory encoder 304. More particularly, memory decoder 404 receives at its input a sequence $c_n$ of uncoded points in set A produced by codebook decoder 402. The sequence $c_n$ enters and is selectively multiplied by $-1$ by sign inverter 700. Sign inverter 700 is controlled by the input bit $g_n$ ($g_n$ is the exclusive-or of the values of the bits $e_n$ and $j_n$). When $g_n=1$, sign inverter 700 multiplies $c_n$ by $-1$ to produce the output $a_n$. When $g_n=0$, sign inverter 700 passes the value of $c_n$ unchanged (i.e., $c_n=a_n$). The output $a_n$ of sign inverter 700 and the signal $-m_n$ enter adder 708. The output $a_n-m_n$ of adder 708 is input to source filter 714 and also is fed back through filter 704 and exclusive-or gate 710.

In higher dimension systems, or systems using higher-dimensional trellis codes, several samples of the sequence $c_n$ are concatenated to represent a single higher-dimensional signal point. In such systems, sign inverters 504 and 700 are replaced with a means for selectively rotating the signal points, for example, by 90, 180, or 270 degrees.

Figure 6:
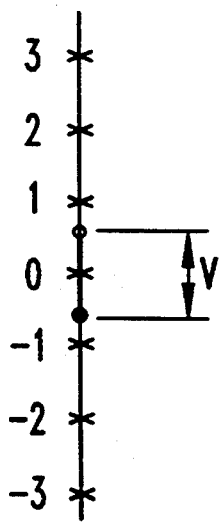
FIG. 6 plots the lattice used by the modulo operation means in the memory decoder of FIG. 7, and the Voronoi region V of the lattice.

Modulo operation means 702 receives the output $f_n$ of filter 704 and quantizes it to the closest point $q_n$ on the Z lattice of FIG. 6 such that the negative of the quantization error is in the Voronoi region V. Modulo operation means 702 produces two outputs, namely, $e_n$ and $m_n$. The output $e_n$ is a one-bit output which has a value of 0 if $q_n$ is a point on 2Z and a value of 1 if $q_n$ is a point on 2Z+1. The other output from modulo operation means 702, $m_n$, is the negative of the quantization error. The value of $m_n$ equals $f_n-q_n$ ($m_n$ is the dither sequence that is subtracted from $a_n$).

Trellis coder 706 is a finite-state machine (based on a convolutional coder) that tracks the progress of the output sequence $Y_n$. Each current $Y_n$ which is input to the trellis coder takes the finite-state machine to the next state. Trellis coder 706 outputs a one-bit output $j_n$. When the current trellis state allows points in set A, $j_n=0$. When the current trellis state allows points in set B, $j_n=1$.

Source filter H(z) 714 regenerates the output $Y_n$ of Viterbi trellis decoder 302 (except in the case of a codebook overload) by introducing memory into its input sequence $b_n=a_n-m_n$.

The intersymbol interference coded quantizer of the present invention provides many advantages over prior quantizers such as the quantizer described in Laroia et al., "A New Structured Quantizer for Sources With Memory," mentioned above. For example, the prior quantizer used a memory encoder/decoder which produced a dither sequence that is larger in power than the corresponding dither sequence $m_n$ of the present invention. The presence of the dither sequence implies that the actual boundary of the innovations codebook is an approximation of the desired boundary. Thus, smaller dither sequence power results in a better approximation of the desired innovations codebook boundary. A larger dither sequence can significantly reduce performance at lower quantization rates. Also, the power of the dither sequence in the prior system depends on and increases with the number of coset partitions used to generate the trellis code. The present scheme advantageously results in the dither power being independent of the number of coset partitions used to generate the trellis code.

Figure 8:
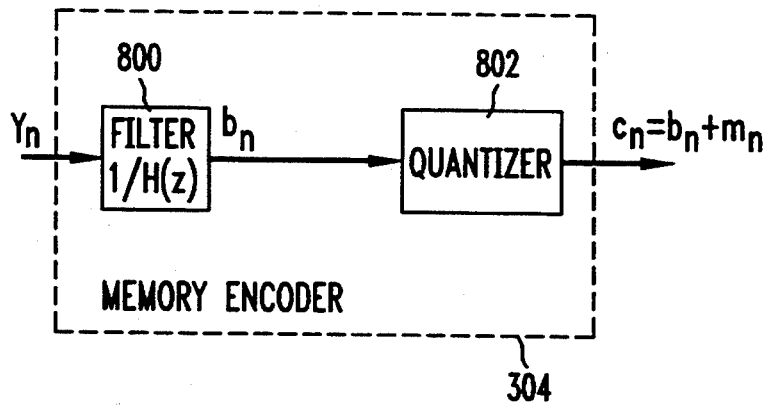
FIG. 8 is a block diagram of an alternative embodiment of the memory encoder of the transmitter of FIG. 3.
Figure 10:
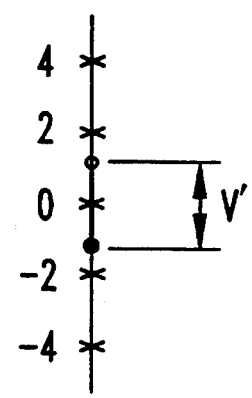
FIG. 10 plots the 2Z lattice used by the modulo operation means in the memory decoder of FIG. 9, and the Voronoi region V' of the lattice.

FIG. 8 shows an alternative embodiment of memory encoder 304. The memory encoder of FIG. 8 includes a filter 800 having a transfer function 1/H(z) (which is the inverse of source filter 100) and a quantizer 802. Filter 800 operates to remove the memory from the input trellis sequence $Y_n$. Filter 800 outputs a sequence $b_n$ which, because of the filtering operation, no longer consists of points on the lattice translate $Z+\frac{1}{2}$ of FIG. 2. To facilitate codebook encoding, a dither sample $m_n$ is added to each sample $b_n$ of the filter output such that $c_n=b_n+m_n$ is a point in set A that is closest to $b_n$. This is equivalent to quantizing $b_n$ using quantizer 802 to the nearest point in set A, $m_n$ being the negative of the quantization error. The quantization is performed such that the dither sample $m_n$ is in the Voronoi region V' of the lattice 2Z shown in the plot of FIG. 10. This quantization operation is invertible (as described below with respect to the memory decoder) and does not add any noise to the final output of the quantizer.

Figure 9:
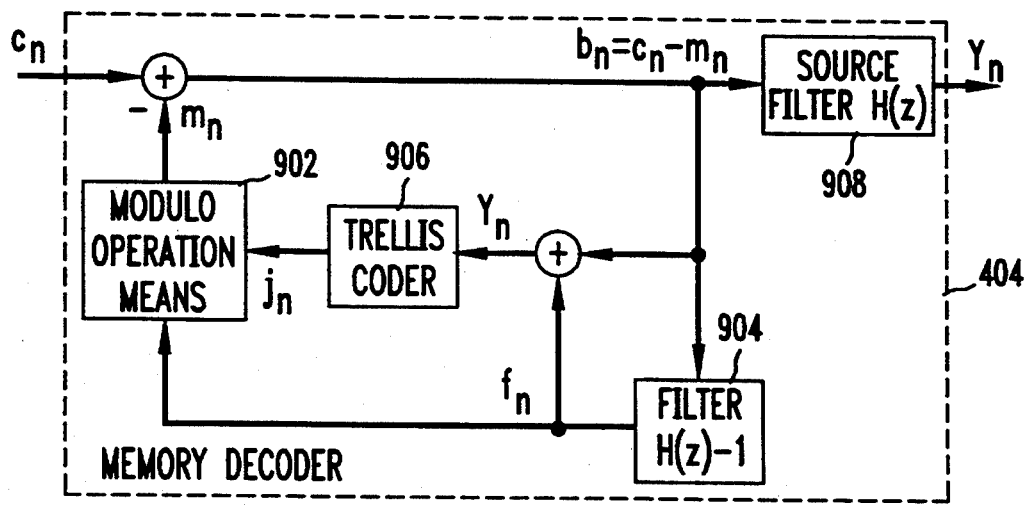
FIG. 9 is a block diagram of an alternative embodiment of the memory decoder of the receiver of FIG. 4.

FIG. 9 shows an alternative embodiment of memory decoder 404. The memory decoder of FIG. 9 includes a modulo operation means 902, a filter 904, a trellis encoder (finite-state machine) 906, and a source filter 908. The memory decoder performs the inverse of the function performed by the memory encoder of FIG. 8. More particularly, the memory decoder receives as its input a sequence $c_n$ of uncoded points in set A produced by codebook decoder 402.

Figure 11:
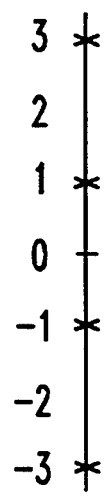
FIG. 11 shows a lattice translate $2Z+1$ also used by the modulo operation means in the memory decoder of FIG. 9.

A dither sample $m_n$ is subtracted from the input sample $c_n$. The dither sample is generated by modulo operation means 902. Modulo operation means 902 operates on the output $f_n$ of filter 904 and is controlled by the one bit output $j_n$ of trellis coder 906. If $j_n=0$, modulo operation means 902 quantizes $f_n$ to the closest point on the 2Z lattice of FIG. 10, and $m_n$ is the negative of the quantization error. If $j_n=1$, modulo operation means 902 quantizes $f_n$ to the closest point on lattice translate 2Z+1 shown in FIG. 11, and $m_n$ is the negative of the quantization error. The quantization is performed such that $m_n$ is always in the Voronoi region V' shown in FIG. 10.

Trellis coder 906 is a finite-state machine (e.g., convolutional encoder) that tracks the progress of the output sequence $Y_n$. Each current $Y_n$ which is input to the trellis coder takes the finite-state machine to the next state. When the current trellis state allows points in set A, the output $j_n$ of trellis coder 906 is zero. When the current trellis state allows points in set B, $j_n=1$.

Source filter H(z) 908 regenerates the output $Y_n$ of Viterbi trellis decoder 302 (except in the case of a codebook overload). Source filter 908 regenerates the output by introducing memory into its input sequence $b_n=c_n-m_n$.

It will be apparent to one skilled in the art that other modifications can be made to the described embodiments without departing from the scope of the invention. For example, although the invention has been described in the context of one-dimensional trellis coded signal points, the present invention is equally applicable to trellis codes of higher dimensions, and to other signal-space codes. Also, the invention is applicable to higher dimension sources with memory, that is, sources generated by higher dimension filters, for example, two-dimensional filters.

I claim:

1. A method comprising the steps of:
   quantizing a sequence of data generated by a source with memory to a nearest sequence of a predetermined trellis code, the trellis code being based on coset partitioning of a predetermined lattice;
   filtering the trellis code sequence with an inverse source filter; and
   adding a dither sample to each sample of the filtered trellis code sequence, such that (1) a sum of the dither sample and the filtered trellis code sequence sample lies on said lattice, and (2) the dither sample is inside the Voronoi region of said lattice.

2. The invention of claim 1 wherein said data are sampled speech data.

3. The invention of claim 1 wherein said data are discretized data.

4. A method comprising the steps of:
quantizing a sequence of data generated by a source with memory to a nearest sequence of a predetermined trellis code, the trellis code being based on coset partitioning of a predetermined lattice into translates of a coset lattice;
filtering the trellis code sequence with an inverse source filter; and
adding a dither sample to each sample of the filtered trellis code sequence, such that (1) a sum of the dither sample and the filtered trellis code sequence sample lies on a super-lattice of said coset lattice, and (2) the dither sample is inside the Voronoi region of said super-lattice.

5. The invention of claim 4 wherein said data are sampled speech data.

6. The invention of claim 4 wherein said data are discretized data.

7. Apparatus for quantizing data from a source with memory, the apparatus comprising:
transmitter means for performing a nonlinear, invertible transformation on a filtered sequence of a predetermined trellis code that is based on coset partitioning of a predetermined lattice into translates of a coset lattice, the transformation adding a dither sample to each sample of said filtered trellis code sequence, such that (1) a sum of the dither sample and the filtered trellis code sequence sample lies on a super-lattice of said coset lattice, and (2) the dither sample is inside the Voronoi region of said super-lattice.

8. Apparatus for quantizing data from a source with memory, the apparatus comprising:
transmitter means for performing a nonlinear, invertible transformation on a filtered sequence of a predetermined trellis code that is based on coset partitioning of a predetermined lattice, the transformation adding a dither sample to each sample of said filtered trellis code sequence, such that (1) a sum of the dither sample and the filtered trellis code sequence sample lies on said predetermined lattice and (2) the dither sample is inside the Voronoi region of said lattice.

9. Receiver apparatus for processing a received signal that was generated by adding a dither sample to each sample of a sequence obtained by filtering a sequence from a predetermined trellis code, the trellis code sequence being obtained by quantizing an output signal from a source with memory, said trellis code being based on coset partitioning of a predetermined lattice, such that (1) a sum of the dither sample and the filtered trellis code sequence sample lies on a super-lattice of said coset lattice, and (2) the dither sample is inside the Voronoi region of said super-lattice, the receiver apparatus comprising:
means including a decoder for recovering from said received signal a quantized output which is an approximation of the data output by said source.

10. The invention of claim 9 wherein the decoder comprises:
codebook decoder means for converting a sequence of binary data received from the channel into a memoryless uncoded sequence of signal-space points; and
memory decoder means for transforming the memoryless uncoded sequence into a coded sequence of said trellis codes reflecting said memory of said source.

11. The invention of claim 10 wherein the memory decoder means comprises a finite-state machine which generates said trellis code, the finite-state machine having a current input which is a function of a current sample of the output trellis coded sequence representing a quantized output signal from said source.

12. The invention of claim 10 wherein the memory decoder means comprises means for subtracting a dither sample from each sample of said memoryless uncoded sequence of signal-space points, wherein the dither sample lies in the Voronoi region of said super-lattice.

13. The invention of claim 12 wherein the memory decoder means further comprises a source filter which receives a sequence of signal-space points from said means for subtracting.

14. The invention of claim 10 wherein the memory decoder means comprises:
means for selectively rotating the samples of the memoryless uncoded sequence to generate a second sequence of samples; and
means for subtracting a dither sample from each sample of the second sequence, wherein the dither sample lies in the Voronoi region of said lattice.

* * * * *